(12) United States Patent
Ginther

(10) Patent No.: US 7,153,045 B2
(45) Date of Patent: Dec. 26, 2006

(54) ELECTRO-MECHANICAL SYSTEM AND METHOD FOR MIXING REPLENISHMENT FOR PLATE PRECURSOR DEVELOPERS

(75) Inventor: Dean Ginther, Greeley, CO (US)

(73) Assignee: Eastman Kodak Company, Rochester, NY (US)

( * ) Notice: Subject to any disclaimer, the term of this patent is extended or adjusted under 35 U.S.C. 154(b) by 174 days.

(21) Appl. No.: 11/031,743

(22) Filed: Jan. 7, 2005

(65) Prior Publication Data

US 2006/0153561 A1 Jul. 13, 2006

(51) Int. Cl.
G03D 3/02 (2006.01)

(52) U.S. Cl. .......................... 396/626; 430/30; 355/27

(58) Field of Classification Search .............. None
See application file for complete search history.

(56) References Cited

U.S. PATENT DOCUMENTS

| | | | |
|---|---|---|---|
| 5,223,881 A | 6/1993 | Nakagawa et al. | |
| 5,479,233 A | 12/1995 | Takekoshi et al. | |
| 6,143,479 A | 11/2000 | Fiebag et al. | |
| 6,270,677 B1 | 8/2001 | Gopal et al. | |
| 6,364,544 B1 | 4/2002 | Sasayama et al. | |
| 6,391,530 B1 | 5/2002 | Timpe et al. | |
| 2004/0099602 A1 | 5/2004 | Ogawa et al. | |
| 2005/0076801 A1 | 4/2005 | Miller et al. | |
| 2005/0079452 A1 | 4/2005 | Miller et al. | |

FOREIGN PATENT DOCUMENTS

| EP | 0 556 690 | 2/1993 |
|---|---|---|
| EP | 1 522 897 | 4/2005 |
| EP | 1 522 898 | 4/2005 |

*Primary Examiner*—D. Rutledge
(74) *Attorney, Agent, or Firm*—Faegre & Benson

(57) ABSTRACT

The present invention provides a system and method for replenishing a lithographic printing plate developer. The system includes a developer unit containing a seasoned developer and adapted to deliver the seasoned developer into a mixing unit, a replenisher unit containing a replenisher and adapted to deliver the replenisher into the mixing unit, and the mixing unit is in fluid communication with the developer unit and the replenisher unit and is adapted to hold a mixture of an equal volume of the replenisher and the seasoned developer. The mixture of an equal volume of the replenisher and the seasoned developer is then delivered to the developer unit.

18 Claims, 2 Drawing Sheets

ELECTRO-MECHANICAL SYSTEM AND METHOD FOR MIXING REPLENISHMENT FOR PLATE PRECURSOR DEVELOPERS

BACKGROUND

The art of lithographic printing is based on the immiscibility of ink and water. A lithographic printing plate is composed of ink receptive regions, commonly referred to as the "image area," and hydrophilic regions. When the surface of the printing plate is moistened with water and printing ink is applied, the hydrophilic regions retain the water and repel the printing ink, and the image area retains the printing ink and repels the water. The printing ink retained on the image area may then be transferred to the surface of a material upon which the image is to be reproduced. Typically, the ink is first transferred to an intermediate blanket, which in turn transfers the ink to the desired surface.

Lithographic printing plate precursors typically include a radiation-sensitive coating applied over the hydrophilic surface of a substrate. Conventional radiation-sensitive coatings include photosensitive components dispersed within an organic polymeric binder. After a portion of the coating is exposed to radiation (commonly referred to as imagewise exposure), the exposed portion becomes either more developable or less developable in a particular liquid than an unexposed portion of the coating. A printing plate precursor is generally considered a positive-working plate if, after exposure to radiation, the exposed portions or areas of the radiation-sensitive coating become more developable and are removed in the developing process to reveal the hydrophilic surface. Conversely, the precursor is considered a negative-working plate if the exposed portions or areas become less developable in the developer and the unexposed portions or areas are removed in the developing process.

After imaging, the precursors are contacted with a developer to remove either the exposed or unexposed portions of the radiation-sensitive coating to form a printing plate. This process is generally performed using a liquid developer system, which receives imaged printing plate precursors, and then contacts the imaged precursors with the liquid developer either by spraying the developer onto the imaged precursor or by immersing the imaged precursor in a developer bath. During development, portions of the radiation-sensitive coating are removed from the imaged precursor to reveal the substrate surface, and portions remain on the plate to provide an ink-receptive image. Oftentimes, the used developer is filtered and then reused to develop additional imaged precursors. Examples of developers used in such processes include 956 brand developer, MX 1813 brand developer and Aqua-Image brand developer, all of which are available from Kodak Polychrome Graphics, Norwalk, Conn.

During the development of a large number of printing plate precursors, the activity of a developer (i.e. the ability of the developer to remove desired portions of the radiation-sensitive coating to produce an image) may vary due to the depletion of, or changes in, various components of the developer. In one example, the concentration of the active solvent or the dispersing agent may become depleted. In another example, the pH of the developer may vary. Changes in developer activity may be caused by loss of developer volume as printing plates carry developer out of the developer apparatus. Additionally, interactions with the radiation-sensitive coatings of the printing plate precursors may also affect developer activity. In particular, the pH of the developer may change due to acid/base interactions with radiation-sensitive coatings. This loss of developer activity may result in inconsistency in overall dot density over a cycle of developed printing plates, which may have adverse effects during printing.

If the developer has a measurable electrical conductivity, as is usually the case with aqueous alkaline developers, users often monitor the electrical conductivity of the developer during the development process to determine the efficiency of the developer. As soon as a weakening of the developer efficiency is established by finding of a lower electrical conductivity, the developer is refreshed by adding either fresh developer or a replenisher composition (that may have a higher concentration of hydroxide ions than the developer) to the depleted or weakened developer until the electrical conductivity of the developer again reaches its original value.

As described in EP-A-0 556 690, the electrical conductivity of a developer does not always decrease when the alkalinity decreases during the development process. Depending on the kind of developer system and also on the kind of plate being developed, the electrical conductivity of the developer may be constant, may increase, or may decrease during use, even though the efficiency of the developer decreases in each case. According to one theory, it is assumed that ingredients of the removed radiation-sensitive layer of the developed printing plates and/or side reactions are responsible for the production of new conductive ions. These ions at least partially compensate or even overcompensate the loss of electrical conductivity due to consumption of hydroxide ions of the developer, thus producing a measured electrical conductivity that is not as low as it would be expected due to the consumption of hydroxide ions by the developing process. Measuring the electrical conductivity does not therefore allow a conclusion on the efficiency or activity of the developer in every case. Constant or unchanging conductivity values therefore do not guarantee the developer activity required for the desired consistent developing results.

There are a number of systems that use computer-controlled systems and elaborate algorithms to determine the activity of the developer. For example, EP-A-0 556 690 discloses a computer controlled system for refreshing the partially exhausted developer for those cases where the value of the electrical conductivity is not a measure for the activity of the developer. However, this system requires an expensive computer-controlled system. Therefore, there is a need for a developing process or system that does not require expensive equipment, and does not require skilled workers for its operation. Furthermore, there is a need to reduce the total consumption and the discharge of exhausted printing plate precursor developers.

SUMMARY OF THE INVENTION

In one embodiment, the invention is directed to a system for replenishing a lithographic printing plate developer. The system includes a developer unit containing a seasoned developer and adapted to deliver the seasoned developer into a mixing unit, a replenisher unit containing a replenisher and adapted to deliver the replenisher into the mixing unit, and the mixing unit is in fluid communication with the developer unit and the replenisher unit and is adapted to hold a mixture of an equal volume of the replenisher and the seasoned developer. The mixture of an equal volume of the replenisher and the seasoned developer is then delivered to the developer unit.

The developer unit further includes a developer tank adapted to receive the mixture of an equal volume of the replenisher and the seasoned developer from the mixing unit and to deliver seasoned developer to the mixing unit. The developer tank is further adapted to receive printing plate precursors and to apply developer to the printing plate precursors. The developer unit further includes a pump to deliver the seasoned developer into the mixing unit. The developer unit further includes an outlet to drain excess seasoned developer into a waste unit.

The replenisher unit may include a replenisher tank adapted to receive replenisher. The replenisher unit also includes a pump to deliver the replenisher into the mixing unit.

The mixing unit may include a mixing tank. The mixing tank further includes a mixing device to mix the mixture of the equal volume of the replenisher and the seasoned developer. The mixing unit also includes a float switch to maintain a constant volume of the mixture of the equal amount of the replenisher and the seasoned developer in the mixing unit. The mixing unit also includes a pump to deliver the mixture of the equal volume of the replenisher and the seasoned developer into the developer unit.

The system may also include one or more sensors to monitor the activity of the developer. In one embodiment, a sensor is adapted to monitor developer activity, such as conductivity of the developer. In another embodiment, the sensor is adapted to monitor the number of printing plate precursors developed and/or the total printing plate precursor area developed.

In another embodiment, the invention is directed to a method for replenishing a developer. The method includes mixing a mixture of an equal volume of a seasoned developer and a replenisher in a mixing unit and delivering the mixture of an equal volume of a seasoned developer and a replenisher to a developer unit. The mixture of an equal volume of a seasoned developer and a replenisher is delivered to the developer unit as a function of a predetermined number of precursor plates developed or developer activity.

In still another embodiment, the present invention is directed to a replenisher for replenishing a developer system that includes a mixture of an equal amount of a seasoned developer and a replenisher.

DETAILED DESCRIPTION

Figure 1:
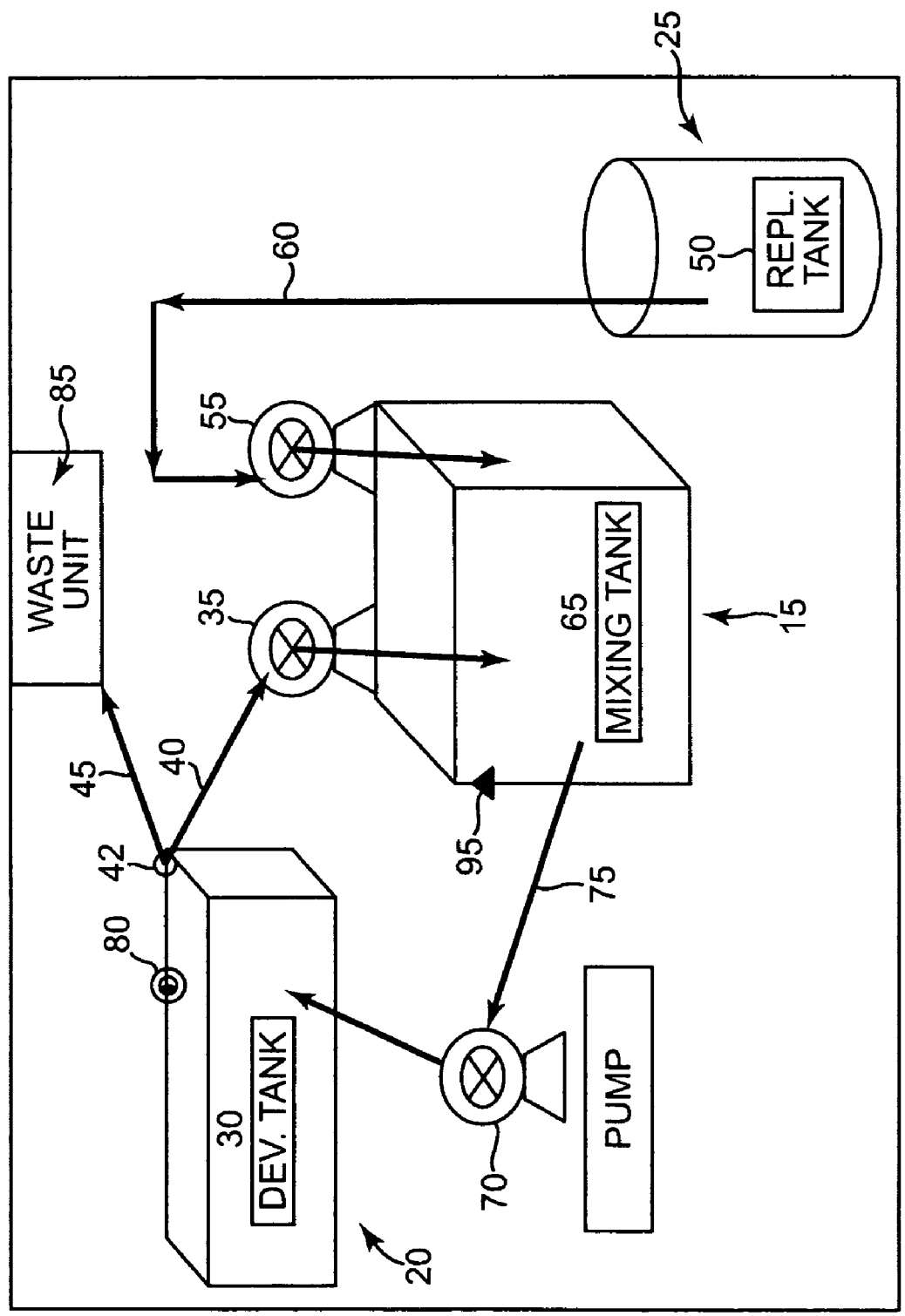
FIG. 1 is a schematic illustration of an embodiment of the present invention for an exemplary mixing system.

A mixing system for a developing system for printing plate precursors, such as the mixing system 10 illustrated in FIG. 1 includes a mixing unit 15 which is adapted to hold a mixture of depleted/used developer, (referred as the seasoned developer) and replenisher. As used herein, the term "replenisher" refers to a substance having approximately the same activity as the original developer or a substance having a different level of activity than the developer to which it is added. Thus, in the former situation the original developer itself is often used as a replenisher to maintain the volume of developer contained in the developer tank 30. In the latter situation, the replenisher may have a different pH or solvent concentration than the developer. Examples of such replenishers include 9008 brand regenerator, MX 1919 brand regenerator and Aqua-Image Top-Off brand regenerator, all available from Kodak Polychrome Graphics, Norwalk, Conn.

The mixing system 10 includes a developing unit 20 that contains the seasoned developer and the replenisher unit 25 that contains replenisher. The developing unit 20 is adapted to deliver seasoned developer into the mixing unit 15. The replenisher unit 25 is adapted to deliver replenisher into the mixing unit 15.

The developer unit 20 includes a developer tank 30 and a pump 35. Conduit 40 connects the developer tank 30 to the mixing unit 15. The volume of liquid held in the developer tank 30 is maintained at a constant level. No net volume change occurs from the start to end of the cycle. The volume of seasoned developer removed is equal to the volume of the mixture of an equal volume of the replenisher and the seasoned developer added. This constant volume in the developer tank 30 is achieved by including an outlet 42 that drains excess seasoned developer from the developer tank 30 through conduit 45 into a waste unit 85. When pump 35 is activated, seasoned developer is transferred from the developer tank 30, through conduit 40 into the mixing unit 15. If required, excess seasoned developer is transferred from developer tank 30, through conduit 45 into waste unit 85. The developer unit 20 is adapted to deliver a volume of seasoned developer in an amount equal to the volume of replenisher being delivered into the mixing unit 15.

The developer unit 20 is also adapted to hold the developer and apply developer to printing plate precursors received by the developer unit. Any number of ways known to one skilled in the art may be used to apply the developer to the printing plates. For instance, developer may be applied by contacting the developer to the printing plate precursors in the developer tank 30, or by pumping the developer out of sprayers directed towards the printing plate precursors.

The replenisher unit 25 includes a replenisher tank 50 and a pump 55. Conduit 60 connects the replenisher tank 50 to the mixing unit 15. When pump 55 is activated, replenisher is delivered from the replenisher tank 50 through conduit 60 into the mixing unit 15. The replenisher unit 25 is adapted to deliver replenisher in a volume equal to the volume of seasoned developer being delivered into the mixing unit 15.

The mixing unit 15 includes a mixing tank 65 and pump 70. Conduit 75 connects the mixing tank 65 to the developer unit 20. The mixing tank 65 is adapted to receive and hold an equal volume of the replenisher, which is transferred from the replenisher tank 50 via the conduit 60 and an equal volume of seasoned developer from the developing tank 30, which is transferred from the developing tank 30 through conduit 40 into to the mixing tank 65.

The mixing unit 15 may further include a mixing device 90 to aid in mixing the equal volume of seasoned developer and replenisher. After an equal volume of the seasoned developer and replenisher are mixed in the mixing tank 65, the mixture is transferred to the developing tank 30 for further use by the activation of pump 70, which pumps the mixture from the mixing tank 65 through conduit 75 into the developing tank 30. The mixing unit 15 may further include a float switch 95 to maintain the volume of the mixture of the equal volume of the replenisher and the seasoned developer in the mixing unit. The level of the mixture is maintained constant in the mixing tank 65 with the aid of a float switch 95. When the level of mixture in the mixing tank 65 is low, the float switch 95 energizes the pumps 35 and 55 to pump an equal volume of seasoned developer from the developing tank 30 and an equal volume of replenisher from the replenisher tank 50. When the level of the mixture in the mixing tank 65 is achieved, the float switch de-energizes the pumps 35 and 55, thereby maintaining the constant volume of the mixture in the mixing tank 65.

There are a variety of ways to provide controlled delivery of the seasoned developer to the mixing unit 15. In one embodiment, the developer unit 20 includes one or more sensors 80 for monitoring the volume or level of the developer in the developer tank 30. If the developer volume or level is too low, the sensors 80 communicate with the mixing unit 15 to supplement the developer with the mixture of equal volumes of seasoned developer and replenisher. Alternatively, sensors 80 may monitor the developed precursor area or number of developed printing plate precursors, and then communicate with the mixing unit 15 to add the mixture to the developer tank 30 as a function of unit area of developed precursor.

In another embodiment, the mixture may be added as a function of the speed at which the developer tank 30 develops the printing plate precursors. For example pumps 35 and 55 may be set to deliver an equal volume of seasoned developer and replenisher respectively at predetermined time intervals into the mixing tank 65. Pump 70 then pumps the mixture into the developing tank 30. In yet a further embodiment, one or more sensors may be used to monitor the activity of the developer. For example, sensors may monitor the pH or conductivity of the developer. Suitable sensor systems are available from Oakton Instruments, Vernen Hills, Ill., and include the D.A.M. and Q.D.M. brand systems. An example of a particular pH sensor is the OAKTON pH/ORP Controller 800 series, available from Oakton Instruments.

The type of replenisher required to maintain the developer activity will vary based on a number of factors apparent to those of skill in the art. Such factors include the volume and specific type of developer, the composition of the printing plate precursors, the composition of the replenisher, the activity level being measured, and the surface area of printing plate precursors being developed. Furthermore, the mixing system 10 of the present invention is adapted to be used with a variety of developers and replenishers to develop various types of printing plate precursors. Examples of suitable developers, and replenishers and printing plate precursors are reported, for example, in the U.S. patent application Ser. No. 10/681,574 entitled "Developer Regenerators," which was filed on Oct. 8, 2003, and which is incorporated herein by reference. In one embodiment, the developer is capable of developing printing plate precursors subjected to laser imaging, more particularly infrared laser imaging.

EXAMPLES

General Processing Conditions

A Kodak Polychrome Graphic Thermal Gold printing plate precursor (8 square feet per plated) was image-wise exposed with 830 nm radiation, using standard test images (Digital Ugra/Forga Kodak Thermal Guide 4.3 version) on a Screen PTR-8600. The resulting imaged plate precursor was developed using an 850 Sword II plate processor that is an 850 mm processor as supplied by Glunz and Jensen, Elkwood, Va., in the following configuration:

Developer=MX 1813 Developer, available from Kodak Polychrome Graphics, Norwalk, Conn.

Developer filter=150 micron cotton

Processing speed=3 ft/min

Developer tank size=10 gallons

Temperature of Developer=24° C.

Replenisher=MX1919, available from Kodak Polychrome Graphics, Norwalk, Conn.

QDM board: a circuit board that controls the dosage of the replenisher per plate or by conductivity Plate resolution was then measured using an X-Rite 528 densitometer (Cannon Direct, Bethel, Ohio).

Determining Fog Point

The fog point was determined by visual observation of minor coating retention in the background area following development. This was confirmed by determining the clear out temperature at which no coating was retained on development. After the fog point temperature had been determined, the preheat temperature was set to 10° F. below the fog point.

The fog points were determined for each plate size. The printing plate precursors were preheated in a Wisconsin Heavy Duty 34" oven at a transport speed of 3 feet per minute. The oven temperature was first set at 270° F. Plates that had not been imaged were used. These un-imaged plates were placed into the oven. If the oven temperature was below the fog point, the plate was completely devoid of fog or density. The preheat temperature was subsequently raised in increments of 2° F. The oven was allowed to stabilize for 15 minutes after a change in temperature. Raising the temperature and processing of the plates continued until the first sign of visible coating retention (i.e. the fog point) was observed. Processing conditions were as described above. After determining the fog point temperature, the temperature was reduced by 2° F. to confirm that the plates became clear (lack visible coating retention). This was the reference point for the particular plate size. Dropping 10° F. from the reference point set the preheat operating temperature.

If a number of different plates were used, the fog point of each plate size was determined such that one pre-heat oven temperature setting would work for all the plate sizes.

When un-imaged Kodak Polychrome Graphic Thermal Gold plates (8 square/feet per plate) were used, and the transport speed of the un-imaged plate through the oven was set at 3 feet per min., the fog point was determined at 280° F. The pre-heat operating temperature was subsequently set at 270° F.

Standard Developer Cycle

Change in conductivity and fog point was determined over the course of 1100 printing plate precursors using standard developer, MX 1813, available from Kodak Polychrome Graphics, Norwalk, Conn.

The conductivity measurement in ohms was determined with a processor on-board conductivity meter with Automatic Temperature Compensation (ATC).

The fog point and preheat oven operating temperature was first determined as described above. Change in fog point is the change from the fog point temperature that was first established with the original fresh chemistry. The results are shown in Table 1.

TABLE 1

| Plate Count | Fog Point | Conductivity |
| --- | --- | --- |
| 0 | 270 | 89.6 |
| 80 | 270 | 89.8 |
| 130 | 270 | 89.5 |

TABLE 1-continued

| Plate Count | Fog Point | Conductivity |
|---|---|---|
| 160 | 269 | 88.9 |
| 240 | 269 | 88.6 |
| 320 | 269 | 88.4 |
| 370 | 269 | 87.8 |
| 470 | 269 | 87.9 |
| 560 | 269 | 87.2 |
| 600 | 269 | 87.1 |
| 680 | 268 | 85.9 |
| 720 | 268 | 85.9 |
| 800 | 268 | 85.3 |
| 850 | 268 | 85.3 |
| 930 | 267 | 85.3 |
| 1010 | 267 | 84.2 |
| 1070 | 267 | 83.4 |
| 1100 | 267 | 83.3 |

Example 1

Change in Conductivity and Fog Point

Change in fog point and conductivity was determined over the course of 1000 printing plate precursors using the MX1813 developer replenished with MX1919. A 1:1 ratio of the seasoned developer and replenisher was added after every plate developed. The fog point and preheat oven operating temperature was first determined as described above. The conductivity measurement in ohms was determined with a processor on-board conductivity meter with ATC.

Figure 2:
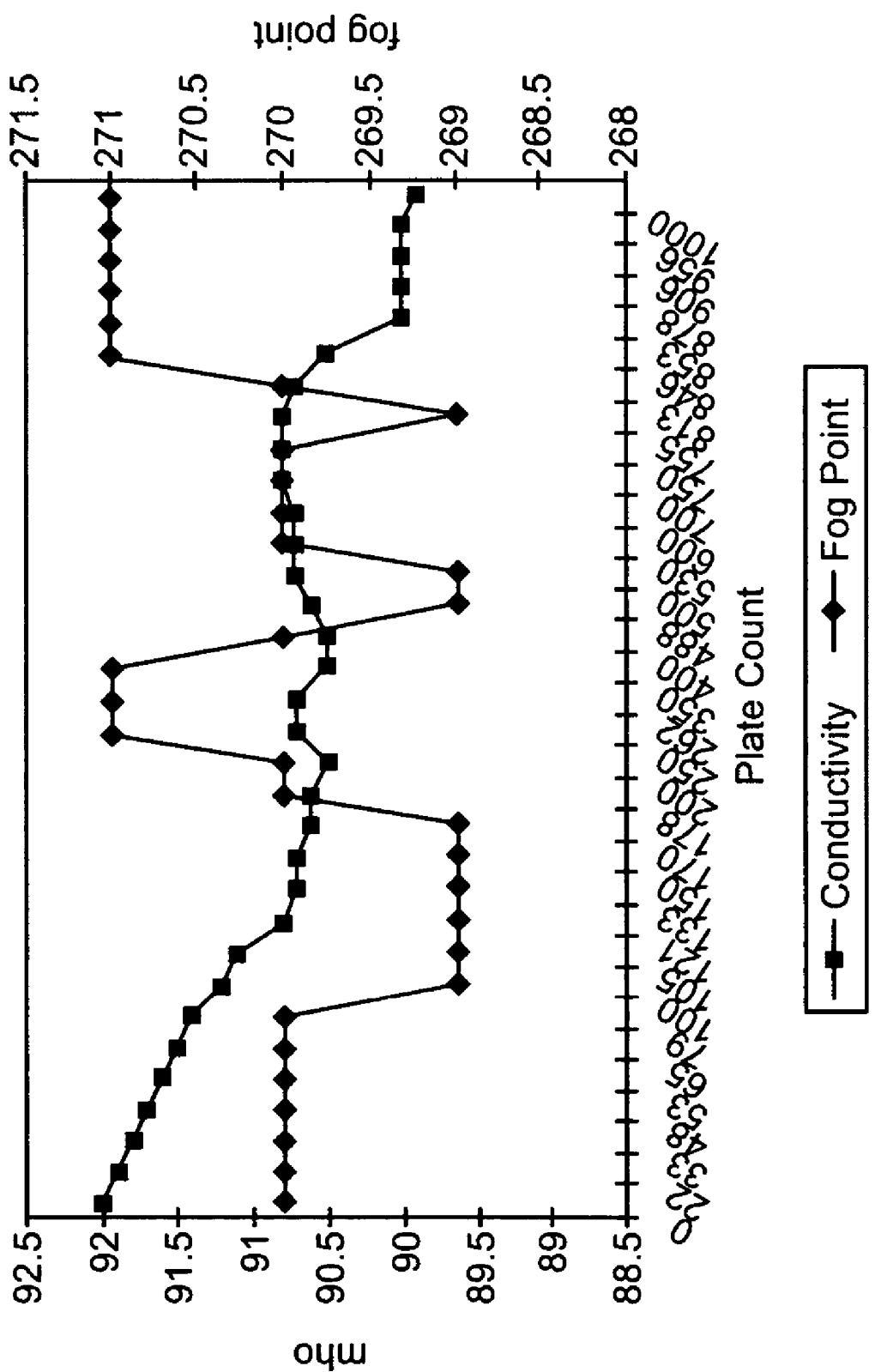
FIG. 2 is a graph showing the change in conductivity and fog point over a 1000-plate cycle using the MX1813 developer replenished after every plate processed with MX1919.

The data shown in FIG. 2 demonstrated that when the MX1919 replenisher was used the fog point shift was within approximately a 2° F. change. The normal fog point shift from start to the end of a cycle using only developer was an approximately 3° F. downward shift, as shown in Table 1.

FIG. 2 demonstrated that the developer conductivity dropped by 2 to 3 conductivity points during the course of the 1000-plate precursor cycle compared to the a system when only developer was used (see Table 1).

Example 2

Mix Ratio Testing

The exposure conditions as detailed above were repeated and developed using the ratios of replenisher to seasoned developer as shown in Table 2. The original developer, MX1813 was replenished with MX1919. The conductivity readings (ohms) were monitored using a processor on-board conductivity meter with ATC. The results are shown in Table 2.

TABLE 2

| Plate Count | 3:1 | 1:1 | 1:3 |
|---|---|---|---|
| 0 | 92 | 92 | 92.5 |
| 22 | 91.9 | 91.9 | 91.9 |
| 33 | 91.9 | 91.8 | 91.7 |
| 48 | 91.8 | 91.7 | 91.3 |
| 53 | 91.8 | 91.6 | 90.9 |
| 65 | 91.7 | 91.5 | 90.7 |
| 79 | 91.6 | 91.4 | 90.5 |
| 100 | 91.6 | 91.2 | 90.4 |
| 105 | 91.4 | 91.1 | 90.1 |
| 121 | 90.9 | 90.8 | 90.1 |
| 133 | 90.7 | 90.7 | 89.9 |

TABLE 2-continued

| Plate Count | 3:1 | 1:1 | 1:3 |
|---|---|---|---|
| 150 | 90.7 | 90.7 | 89.7 |
| 170 | 90.6 | 90.6 | 89.4 |
| 178 | 90.6 | 90.6 | 89.4 |
| 200 | 90.5 | 90.5 | 89.3 |
| 250 | 90.7 | 90.7 | 89.1 |
| 262 | 90.7 | 90.7 | 88.8 |
| 350 | 90.6 | 90.5 | 88.8 |
| 400 | 90.6 | 90.5 | 88.5 |
| 488 | 90.6 | 90.6 | 88.3 |
| 500 | 90.7 | 90.7 | 88.3 |
| 530 | 90.7 | 90.7 | 88.3 |
| 600 | 90.7 | 90.7 | 88.2 |
| 700 | 90.8 | 90.8 | 87.8 |
| 750 | 90.8 | 90.8 | 86 |
| 800 | 90.8 | 90.8 | 85.4 |
| 850 | 90.7 | 90.7 | 85.3 |
| 900 | 90.5 | 90.5 | 85.2 |
| 1000 | 90.5 | 90 | 85.1 |

The data shown in Table 2 demonstrated that the use of a 1:1 replenisher to seasoned developer is effective in maintaining the developer conductivity during the course of the developer cycle. The developer cycle included not more than 8000 square feet of processing, which translated to a 1000 plate cycle. Using a 1:1 replenisher to seasoned developer, the conductivity dropped only 2 conductivity points below the start of the original developer solution cycle. While a 3:1 ratio of replenisher to seasoned developer showed a drop of less than 2 conductivity points, a 1:1 ratio of replenisher to seasoned developer resulted in a significant reduction in the overall consumption of developer and replenisher without significantly effecting the developer activity. Reducing overall consumption of developer and replenisher also reduces the amount of seasoned developer being discharged.

The invention claimed is:

1. A system for replenishing a lithographic printing plate developer comprising:
   a developer unit containing a seasoned developer and adapted to deliver the seasoned developer into a mixing unit and;
   a replenisher unit containing a replenisher and adapted to deliver the replenisher into the mixing unit; and
   the mixing unit is in fluid communication with the developer unit and the replenisher unit and adapted to hold a mixture of an equal volume of the replenisher and the seasoned developer,
   wherein the mixture of an equal volume of the replenisher and the seasoned developer is delivered from the mixing unit to the developer unit.

2. The system of claim 1 wherein the developer unit further comprises:
   a developer tank adapted to receive the mixture of an equal volume of the replenisher and the seasoned developer from the mixing unit and to deliver seasoned developer to the mixing unit.

3. The system of claim 2 wherein the developer tank is further adapted to receive printing plate precursors and to apply developer to the printing plate precursors.

4. The system of claim 1 wherein the developer unit further comprises a pump to deliver the seasoned developer into the mixing unit.

5. The system of claim 1 wherein the developer unit further comprises an outlet to drain excess seasoned developer into a waste unit.

6. The system of claim 1 wherein the replenisher unit further comprises:
a replenisher tank adapted to receive replenisher.

7. The system of claim 1 wherein the replenisher unit further comprises a pump to deliver the replenisher into the mixing unit.

8. The system of claim 1 wherein the mixing unit further comprises a mixing tank.

9. The system of claim 1 wherein the mixing tank further comprises a mixing device to mix the mixture of an equal volume of the replenisher and the seasoned developer.

10. The system of claim 1 wherein the mixing unit further comprising a float switch to maintain a constant volume of the mixture of the equal amount of the replenisher and the seasoned developer in the mixing unit.

11. The system of claim 1 wherein the mixing unit further comprises a pump to deliver the mixture of the equal volume of the replenisher and the seasoned developer into the developer unit.

12. The system of claim 1 further comprises at least one sensor for monitoring developer activity.

13. The system of claim 12 wherein the sensor is adapted to monitor the pH or conductivity of the developer.

14. The system of claim 12 wherein the sensor is adapted to monitor the volume in the developer unit.

15. The system of claim 12 wherein the sensor is adapted to monitor the developed printing plate precursor areas or number of printing plate precursors developed.

16. A method for replenishing a developer comprising:
mixing a mixture of an equal volume of a seasoned developer and a replenisher in a mixing unit and delivering the mixture of an equal volume of a seasoned developer and a replenisher to a developer unit.

17. The method of claim 16 comprising delivering the mixture of an equal volume of a seasoned developer and a replenisher to the developer unit after a predetermined number of precursor plates have been developed.

18. A replenisher for replenishing a developer system consisting of:
a mixture of an equal volume of a seasoned developer and a replenisher.

* * * * *